(12) United States Patent
Bewley et al.

(10) Patent No.: US 6,282,761 B1
(45) Date of Patent: Sep. 4, 2001

(54) HEAT SINK PRESSURE CLIP

(75) Inventors: William W. Bewley, Falls Church; Edward A. Aifer, Arlington, both of VA (US); Christopher L. Felix, Washington, DC (US); Igor Vurgaftman, Pikesville; Jerry R. Meyer, Catonsville, both of MD (US); John Glesener, Richardson, TX (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 09/492,069

(22) Filed: Jan. 27, 2000

(51) Int. Cl.[7] .............................. A44B 21/00; H01L 23/34
(52) U.S. Cl. .............................................. 24/569; 257/727
(58) Field of Search .............................. 24/535, 567, 568, 24/327; 361/709, 807; 269/219, 240, 246; 257/727

(56) References Cited

U.S. PATENT DOCUMENTS

| | | | |
|---|---|---|---|
| 2,934,803 | * 5/1960 | Allen | 24/569 X |
| 3,812,557 | * 5/1974 | Meyer | 24/569 |
| 4,622,822 | * 11/1986 | Beitner | 269/254 R X |
| 5,127,837 | * 7/1992 | Shah et al. | 439/71 |
| 5,592,021 | * 1/1997 | Meschter et al. | 257/727 |

* cited by examiner

Primary Examiner—Robert J. Sandy
(74) Attorney, Agent, or Firm—John J. Karasek; George A. Kap

(57) ABSTRACT

A pressure clip for contacting a heat sink device to a heat sink by means of a pressure bond having thermal resistance of less than about 5 K/kW/cm$^2$. The pressure clip includes a mounting block, a clamp block; a spacer disposed between the mounting block and the clamp block forming a channel therebetween, support shoulders in the channel for supporting a heat sink, means for securing the clamp block and the spacer to the mounting block, pressure arm disposed above the mounting block, flexible joint for flexibly attaching the pressure arm to the mounting block, pressure screw disposed between the pressure arm and the mounting block for applying pressure to the pressure arm, and a plunger projecting into the channel between the mounting block and the clamp block for transmitting pressure from the pressure arm.

6 Claims, 1 Drawing Sheet

HEAT SINK PRESSURE CLIP

BACKGROUND OF THE INVENTION

1. Field of the Invention

This invention pertains to the field of heat sink pressure clip which forms a pressure bond between a heat source and a heat sink.

2. Description of Prior Art

There is a rapidly increasing demand for efficient IR semiconductor lasers operating at ambient or thermoelectric cooler temperatures. Military needs include countermeasures and communications whereas commercial applications focus on remote chemical sensing and drug monitoring, leak detection, chemical process control, and laser surgery. In both of these markets continuous wave (CW) or quasi-CW laser operation is essential and current thermal management techniques are the primary impediment to these types of operation.

Thermal management involves removing heat from a device which, in the case of lasers, critically affects the efficiency and maximum operating temperature. As a semiconductor laser is either electrically or optically excited, excess thermal energy from joule heating, optical heating, hot-carrier relaxation, etc., must be efficiently removed from the laser's active region to minimize degradation of the laser's performance at elevated temperatures. Standard techniques to accomplish this involve soldering the laser to a heat sink using one of a variety of soldering alloys. The heat sink is usually a high thermal conductivity material such as diamond or copper.

A typical semiconductor laser structure consists of a few microns of epitaxially grown laser material (epitaxial-side) containing the active region disposed on a lattice matched substrate. The substrate can be conveniently thinned to a minimum of about 50 microns. Two configurations for soldering a laser to a heat sink are epitaxial-side-up and epitaxial-side-down. Since most of the heat is generated in the active portion of the epitaxial layer, the heat removal is most efficient when the epitaxial layer directly contacts the heat sink, i.e., epitaxial-side-down. While this configuration is the best thermally, it is technically more complicated than the epitaxial-side-up technique and methods must be employed to insure that the facets of the laser are not obscured or contaminated by the solder or its residue. Even when voids, granularity and/or other imperfections in the solder joint do not significantly impede the heat flow, the intrinsic thermal resistance of a solder layer can be significant.

All of the soldering techniques employed for electrically-pumped semiconductor lasers may be used to fabricate optically-pumped lasers as well. A further difficulty occurs when the laser is soldered epitaxial-side-down, in that the only access by the pump laser is through the substrate. This requires that the substrate be transparent to the pump laser, which is often impractical due to other constraints related to fabrication and convenience.

Most of the currently-used soldering and mounting techniques require considerable device processing. The semiconductor and heat sink are typically patterned with layers of different metals and the soldering must be done in a highly controlled environment. Some common problems encountered in epitaxial-side-down soldering are degradation of the laser due to stress or high-temperature processing, breaking upon thermal cycling, contamination of the laser facets, and poor yield associated with the critical nature of the alignment between the laser facet and the edge of the heat sink.

Although the above discussion focused on the IR semiconductor laser application, it should be understood, however, that similar considerations apply equally to semiconductor lasers emitting in other wavelength ranges and to many other optical and electronic devices for which thermal management issues are important, including nonlinear difference frequency generation and high-power electronic devices.

In a specific embodiment, the pressure clip disclosed and claimed herein includes a base and a pressure arm that are connected by a keyhole flexible joint. Force is applied to the pressure arm by the pressure screw which passes through the arm. Mounted at the end of the pressure arm is a plunger which exerts force on the device. The epitaxially grown layer of a laser is pressed against the diamond heat sink which is thermally grounded to the copper mounting block.

OBJECTS AND SUMMARY OF THE INVENTION

An object of this invention is a means for effecting a pressure bond between a heat source device and heat sink in absence of soldering.

Another object of this invention is a pressure clip that delivers adequate force to the interface between a heat sink and a heat source device to ensure good thermal contact Another object of this invention is a pressure clip that applies force to the interface between a heat sink and a heat source device uniformly.

Another object of this invention is a pressure clip that applies sufficient force to the interface between a heat sink and a heat source device to form a pressure bond therebetween, the application of force is accomplished in a controlled manner from a stable platform.

These and other objects of this invention are achieved by a pressure clip which includes a mounting block, a clamp block, a spacer disposed between the mounting block and the clamp block forming a channel therebetween, shoulders in the channel for supporting a heat sink, screws for securing said clamp block and the spacer to the mounting block, pressure arm disposed above the mounting block, flexible joint for flexibly attaching the pressure arm to the mounting block, pressure screw disposed between the pressure arm and the mounting block for applying pressure to the pressure arm, and a plunger projecting into the channel between the mounting block and the clamp block for transmitting pressure from the pressure arm.

DETAILED DESCRIPTION OF THE INVENTION

This invention pertains to a pressure clip which can be used to provide a pressure bond between a heat source device and a heat sink. The pressure clip is characterized by the fact that it delivers adequate force to the semiconductor/heat sink interface to ensure good thermal contact, that the force is applied uniformly along the interface to prohibit damage to the semiconductor substrate, and that the force is applied in a controlled manner from a stable platform to ensure that the semiconductor substrate does not shift in the process.

The mounting apparatus is a pressure clip which is designed to fulfill three critical requirements for the pressure bond: it provides a method to deliver adequate force to the semiconductor/heat sink interface to ensure good thermal contact; it applies force uniformly along the interface to prohibit damage to the semiconductor substrate; it applies force in a controlled manner from a stable platform to ensure that the substrate does not shift during the process.

Figure 1:
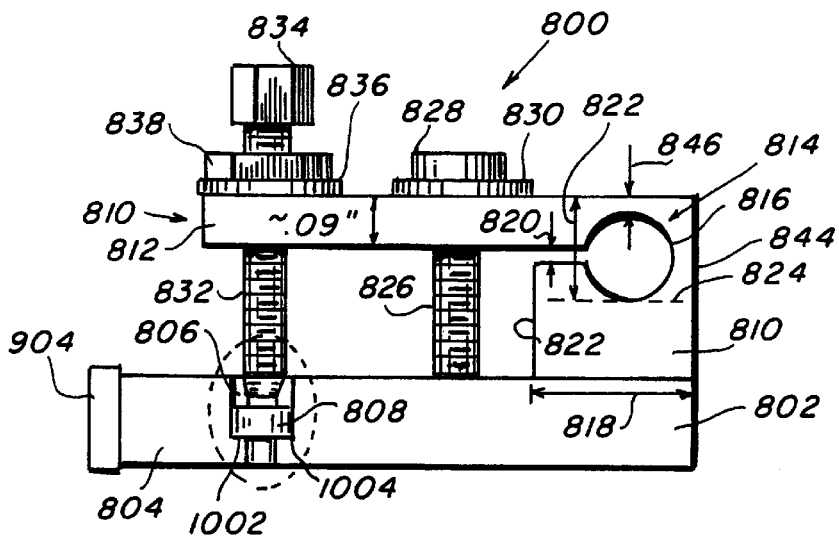
FIG. 1 is the front view of the pressure clip that can be used to apply sufficient pressure to a substrate and heat sink to form the pressure bond at the interface thereof to allow for electrical or optical actuation of the device.
Figure 3:
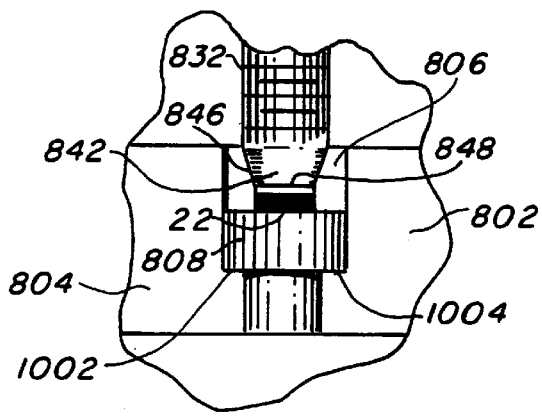
FIG. 3 is an enlarged view of the interaction between a heat sink and a heat source device which can be actuated electrically or optically.
Figure 2:
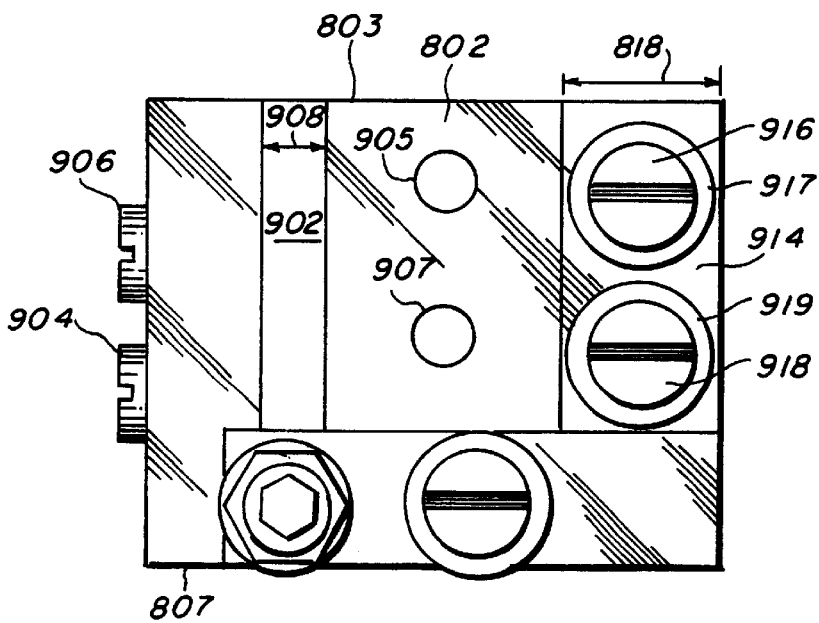
FIG. 2 is the top view of the pressure clip shown in FIG. 1.

The pressure clip 800 shown in FIGS. 1, 2 and 3 includes a mounting rectangular block 802, a separate clamp block 804 which forms channel 806 within which is disposed spacer 902. Screws 904,906 pass through clamp block 804, through spacer 902 and into mounting block 802 to secure spacer 902 in channel 806. Spacer 902 is flush with rear edge 803 of mounting block 802 and extends longitudinally in channel 806 from its rear edge 803 toward the front of pressure clip 800 to within about 3 mm of front edge 807 of clamp block 804. Front edge 807 is flush with front edge of mounting block 802.

Openings 905,907 in mounting block 802 are intended for screws for attaching pressure clip 800 to an underlying cooling structure.

The purpose of spacer 902 is to space clamp bar 804 from mounting block 802 wide enough for heat sink 808 to fit loosely therein, as shown in FIGS. 1 and 3. Width 908 of spacer 902 should be uniform throughout its length in order to position therein heat sink 808 with its parallel sides. If heat sink 808 is 2.5 mm wide, then spacer 902 and channel 806 should be about 2.5 mm wide to accommodate the heat sink. Spacer 902 can be thicker or thinner or be of the same thickness as the mounting block 802. Heat sink 808 rests in channel 806 on shoulders 1002, 1004, as shown in FIGS. 1 and 3. Shoulder 1002 forms a ledge in clamp block 804 and shoulder 1004 forms a ledge in mounting block 802. Length or depth of shoulders 1002, 1004 depends on the depth dimension of heat sink 808. If depth dimension of heat sink is 2.5 mm, then the length or depth of shoulders 1002, 1004 should be at least 2.5 mm, such as about 3 mm, in order to fully accommodate the depth dimension of the heat sink. With provision of the shoulders in the front portions of mounting block 802 and clamp block 804, width of the channel is narrower in the section where the shoulders are, as shown in the enlargement in FIG. 3.

Secured to mounting block 802 is pressure arm assembly 810 which includes pressure arm 812, attachment arm 914, screws 916,918 for securing pressure arm assembly 810 to mounting block 802 and flexible joint 814 connected the pressure arm 812 of the pressure arm assembly 810, as shown in FIG. 1. Pressure arm assembly 810, typically a unitary structure, is a mirror image of letter "L", as shown in FIG. 2 with pressure arm 812 extending leftward at right angle to the attachment arm 914. The flexible joint 814 includes a circular bore 816 in the pressure arm 812 in the far or right extremity of the pressure arm 812. Diameter of the bore 816 is less than the width 818 of the attachment arm 914. The top surface of attachment arm 914 is below the top surface of the pressure arm 812. Bore 816, therefore, extends just above the top surface of attachment arm 914, which is indicated by the dotted line 824 in FIG. 1. Slot 820 in pressure arm 812, which extends leftward from bore 816 to edge 822 of attachment arm 914, provides flexibility to pressure arm 812 together with bore 816.

There is a pair a spaced openings in the attachment arm 914 and a corresponding pair of spaced openings in the mounting block 802 through which pass screws 916, 918 to secure the. pressure arm assembly 810 to the mounting block 802. Elements 917 and 919 are washers for screws 916, 918.

Threaded pressure screw 826 passes through pressure arm 812, which extends parallel and spaced above mounting block 802, and into mounting block 802. Screw head 828 on the top end of pressure screw 826 can control pressure on the pressure arm by screwing the pressure screw in or out. Element 830 is a washer around the pressure screw 826 between the screw and the pressure arm 812. Pressure screw 826 is disposed vertically at about the midpoint of the pressure arm 812, as shown in FIG. 1.

At the end of pressure arm 812 is vertically disposed threaded plunger 832 which extends through pressure arm 812 and into channel 806. Plunger 832 is provided with screw head 834 at its upper extremity, washer 836 around the plunger 832 and on the pressure arm 812, and lock nut 838 disposed around the plunger and on the washer. The function of the lock nut 836 is to lock plunger 832 in place and prevent its up and/or down movement.

Function of plunger 832 is to transmit pressure imparted by the pressure screw 826 to the heat source device disposed on the heat sink in channel 806, and thus form a pressure bond between the heat source device and the heat sink.

The structure forming the pressure bond is shown in the encircled section in FIG. 1, which is shown enlarged in FIG. 3. FIG. 3 shows heat sink 808 resting on shoulders 1002, 1004 in channel 806 with the heat sink device 22 resting on top of the heat sink and well below the top surfaces of mounting block 802 and clamp block 804. If the heat sinking device 22 is a semiconductor laser, its dimensions are typically 2 mm×0.5 mm×150 $\mu$m. Plunger 832 converges through a conical section 840 to a point 842 which presses on the heat source device 22 to form the pressure bond. Typically, the heat generating region of the device is in contact with the heat sink A key feature of the pressure clip 800 is the flexibility of the keyhole joint 814 in combination with rigidity of the of the pressure arm 812 and the stability of the mounting block 802. Flexibility of the joint is provided by its thin walls of 0.032", i.e., dimensions 844, 846 in FIG. 1, in combination with the thickness of 0.090" of its pressure arm 812. This combination insures that as pressure is applied to the pressure arm and it is consequently displaced, most of the flexing occurs in the joint. This minimizes the angular displacement of the tip of the plunger as the pressure arm applies pressure. The angular displacement of the plunger tip is approximately 1.5 milliradians per 0.001" vertical displacement of the plunger.

Minimizing the angular displacement of the tip is important to insure that pressure is applied uniformly to the semiconductor substrate. To compensate for the slight angular displacement, which will inevitably occur, the tip of the plunger is coated with approximately 0.002" of Indium or some other soft Indium alloy or a suitable soft metal to form gasket 848. This gasket 848 deforms to both fill the space and transmit the force between plunger tip 842 and heat source device 22. The length of the hole in the keyhole joint provides lateral and torsional stability for the pressure arm. This provides a stable platform for the process wherein pressure is applied to the arm and is transmitted through the plunger to the semiconductor and insures that the heat source device is not displaced during the process.

Procedure for using the pressure clip in order to form a pressure bond between the heat sink and the heat source device include the following steps:

(a) position and mount heat sink 808 in channel 806 on shoulders 1002, 1004 while applying pressure from the top, and tightening screws 904, 906;

(b) place the heat source device 22 on the heat sink by means of a vacuum pick-up tool or otherwise;

(c) install pressure arm assembly 810 without the pressure screw 826 and with plunger 832 in a raised position;

(d) lower plunger 832 by screwing it in by ½ turns as close to the heat source device 22 as visually possible without touching the devices;

(e) tighten the lock nut 838 on the plunger to render the plunger stationary;

(f) remove the pressure arm assembly 810 from the pressure clip and apply an indium film 848 to the tip 842 of the plunger 832;

(g) re-install the pressure arm assembly 810 without the pressure screw 826;

(h) install pressure screw 826 and tighten it in order to contact the heat source device 22, as verified by visual observation, which results in pressure arm 812 rotating around the keyhole joint 814 and bringing down with it plunger 832 against top of the heat source device;

(i) tighten pressure screw 826 until the interface between the heat sink 802 and the heat source device becomes dark, indicating formation of the pressure bond;

(j) operate the heat source device;

(k) make necessary adjustments from time to time due to thermal cycling and other reasons by re-tightening the pressure screw 826 to re-establish the optimum pressure for the pressure bond.

The main advantage of the pressure clip is that it allows the controlled application of pressure in a manner such that the pressure can be varied without appreciably changing the angle of the plunger tip. The soft metal gasket distributes the pressure uniformly.

While presently preferred embodiments have been shown of the novel invention, and of the several modifications discussed, persons skilled in this art will readily appreciate that various additional changes and modifications may be made without departing from the spirit of the invention as defined and differentiated by the following claims.

What is claimed is:

1. A pressure clip comprising a mounting block, a clamp block, a spacer disposed between said mounting block and said clamp block forming a channel therebetween, support means in the channel for supporting a heat sink, means for securing said clamp block and said spacer to said mounting block, a pressure arm disposed above said mounting block, a flexible joint for flexibly attaching said pressure arm to said mounting block, a pressure screw disposed between said pressure arm and said mounting block for applying pressure to said pressure arm, and a plunger projecting into the channel between said mounting block and said clamp block for transmitting pressure from said pressure arm.

2. The pressure clip of claim 1 including a lock means on said plunger for locking said plunger in a stationary position.

3. The pressure clip of claim 2 wherein said mounting block and said pressure arm are parallel and spaced with respect to each other, and said pressure screw and said plunger are movable in a plane perpendicular to disposition of said mounting block.

4. The pressure clip of claim 3 wherein said support means is a pair of shoulders in cavity with one shoulder provided on said mounting block and other shoulder provided on said clamp block.

5. The pressure clip of claim 4 wherein said flexible joint includes a pressure arm block, means for securing said pressure arm block to said mounting block, a bore in said pressure arm block, and a slot through part of said pressure arm connecting said bore to the exterior of said pressure clip.

6. The pressure clip of claim 5 wherein said bore is disposed transversely to said pressure screw, said slot is disposed transversely to said bore, a width of said pressure arm block is at least a diameter of said bore, said pressure clip includes means for securing said pressure clip to a supporting structure.

* * * * *